United States Patent
Rawat et al.

(10) Patent No.: US 9,208,040 B2
(45) Date of Patent: Dec. 8, 2015

(54) REPAIR CONTROL LOGIC FOR SAFE MEMORIES HAVING REDUNDANT ELEMENTS

(71) Applicant: STMicroelectronics International N.V., Amsterdam (NL)

(72) Inventors: Harsh Rawat, Faridabad (IN); Kedar Janardan Dhori, Ghaziabad (IN); Vinay Kumar, Aligarh (IN); PraveenKumar Verma, Uttar Pradesh (IN)

(73) Assignee: STMicroelectronics International N.V., Amsterdam (NL)

(*) Notice: Subject to any disclaimer, the term of this patent is extended or adjusted under 35 U.S.C. 154(b) by 99 days.

(21) Appl. No.: 14/266,067

(22) Filed: Apr. 30, 2014

(65) Prior Publication Data

US 2015/0317225 A1 Nov. 5, 2015

(51) Int. Cl.
*G06F 11/00* (2006.01)
*G06F 11/20* (2006.01)

(52) U.S. Cl.
CPC ........ *G06F 11/2094* (2013.01); *G06F 2201/85* (2013.01)

(58) Field of Classification Search
USPC ....................................................... 714/6.13
See application file for complete search history.

(56) References Cited

U.S. PATENT DOCUMENTS

| 6,594,783 | B1* | 7/2003 | Dollin | G06F 8/427 714/38.14 |
| 2004/0225964 | A1* | 11/2004 | Simonyi | G06F 8/71 715/256 |
| 2006/0143541 | A1* | 6/2006 | Kay | G06F 3/0619 714/42 |
| 2011/0219209 | A1* | 9/2011 | Reynolds | G06F 9/30 712/16 |
| 2012/0030531 | A1 | 2/2012 | Brewerton et al. | |

* cited by examiner

*Primary Examiner* — Sarai Butler
(74) *Attorney, Agent, or Firm* — Seed IP Law Group PLLC

(57) ABSTRACT

Repair control logic for a safe memory having redundant elements is provided. The repair control logic includes comparison logic including, for each bit slice of a memory array, a comparator circuit configured to determine whether a location value of an associated bit slice of the memory array is greater than a location value of a defective bit slice of the memory array, and data switching logic including, for each bit slice of the memory array, a switching circuit, responsive to a determination that the location value of the associated bit slice is greater than the location value of the defective bit slice, to switch data from the associated bit slice to an adjacent bit slice of the memory array.

20 Claims, 8 Drawing Sheets

REPAIR CONTROL LOGIC FOR SAFE MEMORIES HAVING REDUNDANT ELEMENTS

BACKGROUND

1. Technical Field

This disclosure relates to safe memories having redundant elements. More particularly, the disclosure relates to repair control logic for safe memories wherein the risk of multibit defects is reduced.

2. Discussion of the Related Art

Semiconductor devices are known for high reliability and long operating life. However, reliable and safe operation is critical when human lives depend on the electronic device. Examples of such electronic applications include automobiles and medical devices. In such applications, circuits are designed to minimize the risk of failure to the extent possible.

Electronic devices commonly use a SOC (system on chip) which includes one or more processing devices, one or more memories, input/output circuitry and other circuitry required for a particular application. It is known that memory devices are prone to defects due to local variations in the semiconductor device. A defect in one or more bits of the memory can cause the electronic device to malfunction or fail. As noted, such defects are not acceptable in certain critical applications.

It is known to provide memories with redundant rows and/or columns to allow repair of the memory by inhibiting use of a defective row or column and enabling use of a redundant row or column. A defective row or column may be detected using BIST (built-in self-test) techniques, and the redundant row or column is used in place of the defective row or column.

During operation of the electronic device, error correction techniques may be used to detect errors. An error correction code may be stored with data in the memory and is used to detect an error. Detection of single bit errors is relatively straightforward using known error correction techniques. However, multibit errors are relatively difficult to detect and, in certain applications, may lead to catastrophic results. Accordingly, it is desirable to avoid the use of circuitry which may lead to multibit failures.

SUMMARY

Memories with redundant rows or columns utilize repair control logic to switch data, addressed to a defective row or column, from the defective row or column to a redundant row or column. As used herein, the terms "bit slice" and "bit" refer to a row or column (element) of the memory. The repair control logic may utilize circuitry to switch data from a defective bit slice and all bit slices following the defective bit slice to respective adjacent bit slices and finally to the redundant bit slice. In known repair control logic, a result generated by circuitry in one bit slice may propagate to one or more other bit slices in a so-called "ripple effect". The inventors have recognized that circuitry which involves the ripple effect, in the event of a circuit failure, may cause multibit errors. The disclosure describes repair control logic which eliminates the ripple effect and thereby reduces the risk of multibit errors.

In one aspect, repair control logic for a safe memory having redundant elements is provided. The repair control logic comprises comparison logic comprising, for each bit slice of a memory array, a comparator circuit configured to determine whether a location value of an associated bit slice of the memory array is greater than a location value of a defective bit slice of the memory array, and data switching logic comprising, for each bit slice of the memory array, a switching circuit, responsive to a determination that the location value of the associated bit slice is greater than the location value of the defective bit slice, to switch data from the associated bit slice to an adjacent bit slice of the memory array.

In some embodiments, the comparator circuit for each bit slice of the memory array comprises an equal-to comparator, a greater-than comparator and an OR circuit receiving outputs of the equal-to comparator and the greater-than comparator.

In some embodiments, the comparator circuit for each bit slice of the memory array comprises a greater-than comparator and a value of 1 is added to the location value of the associated bit slice.

In some embodiments, an enable signal for a most significant bit comprises a redundancy enable bit.

In some embodiments, the switching circuit for each bit slice of the memory array is configured to control writing of data to the memory array in response to an enable signal from the respective comparator circuit.

In some embodiments, the switching circuit for each bit slice of the memory array is configured to control reading of data from the memory array in response to an enable signal from the respective comparator circuit.

In some embodiments, the switching circuit for each bit slice of the memory array comprises a multiplexer controlled by an enable signal from the respective comparator circuit.

In another aspect, a method for repair control of a safe memory having redundant elements is provided. The method comprises determining, by a comparator circuit for each bit slice of a memory array, whether a location value of an associated bit slice of the memory array is greater than a location value of a defective bit slice of the memory array; and switching, by a switching circuit for each bit slice of the memory array, data from the associated bit slice to an adjacent element of the memory array in response to a determination that the location value of the associated bit slice is greater than the location value of the defective bit slice.

In another aspect, repair control logic for a safe memory having redundant elements is provided. The repair control logic comprises a comparator circuit configured to determine whether a location value of an associated bit slice of a memory array is greater than a location value of a defective bit slice of the memory array; and a switching circuit, responsive to a determination that the location value of the associated bit slice is greater than the location value of the defective bit slice, to switch data from the associated bit slice to an adjacent bit slice of the memory array.

BRIEF DESCRIPTION OF THE DRAWINGS

For a better understanding of the disclosure, reference is made to the accompanying drawings, which are incorporated herein by reference and in which.

DETAILED DESCRIPTION

Figure 1A:
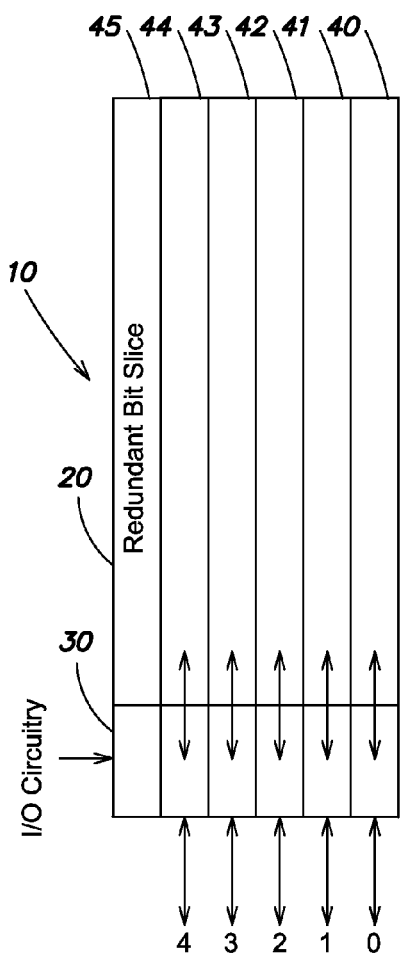
FIG. 1A is a schematic diagram of a memory having a redundant bit slice, illustrating operation in the absence of a defective bit slice.
Figure 1B:
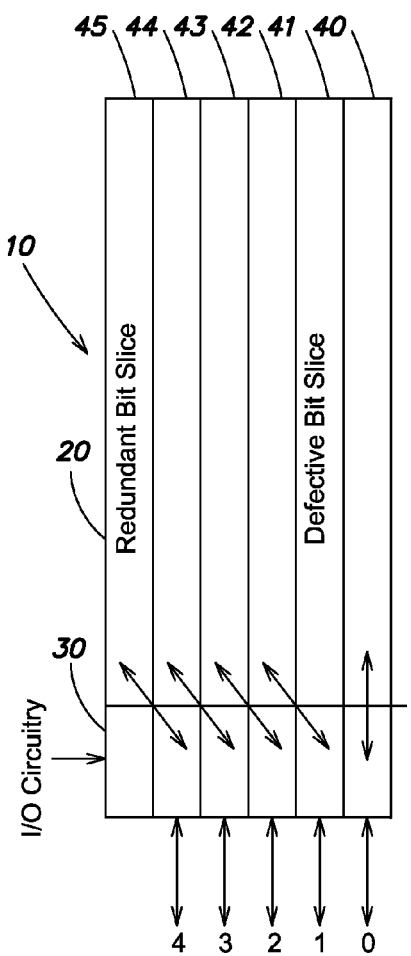
FIG. 1B is a schematic diagram of a memory having a redundant bit slice, illustrating shifting of bit slices in the case of a defective bit slice, in order to use the redundant bit slice.

This disclosure relates to repair control logic for safe memories having redundant bit slices and I/O (Input/Output) circuitry. A simplified schematic diagram of a safe memory having a redundant bit slice is shown in FIGS. 1A and 1B. It will be understood that FIGS. 1A and 1B are simplified to illustrate redundant operation and do not show control and row decoder logic.

Referring to FIG. 1A, a memory 10 includes a memory array 20 and I/O circuitry 30. The memory array 20 includes an array of memory cells arranged in rows and columns. The I/O circuitry 30 writes data to specified addresses in the memory array 20 and reads data from specified addresses in the memory array 20. The read and write operation of memory arrays is well-known and will not be described in detail.

As shown in FIG. 1A, memory array 20 includes bit slices 40, 41, 42, 43, 44 and 45. Each of the bit slices may be a column of the memory array 20. Bit slices 40, 41, 42, 43 and 44 are conventional bit slices, and bit slice 45 is a redundant bit slice. FIG. 1A illustrates the case where a redundant circuit is not enabled or no bit slice of the memory array is defective. In this case, I/O circuitry 30 communicates with bit slices 40, 41, 42, 43 and 44, and redundant bit slice 45 is not utilized, as indicated by arrows in FIG. 1A.

FIG. 1B illustrates a case where bit slice 41 of the memory array is defective. The defective bit slice may be detected by BIST logic. The I/O circuitry 30 receives a location value indicating the location of a defective bit slice. The detection of a defective bit slice using BIST techniques is outside the scope of this disclosure and will not be described in detail.

In the case where bit slice 41 of the memory array is defective, I/O circuitry 30 communicates with the memory array as indicated by the arrows in FIG. 1B. In particular, the I/O circuitry 30 continues to communicate with bit slice 40, which has a lower order than the defective bit slice. The defective bit slice 41 is no longer utilized. Instead, reads and writes to defective bit slice 41 are switched to bit slice 42, reads and writes to bit slice 42 are switched to bit slice 43, reads and writes to bit slice 43 are switched to bit slice 44, and reads and writes to bit slice 44 are switched to redundant bit slice 45, as indicated by arrows in FIG. 1B. Thus, starting with the defective bit slice, the I/O circuitry 30 communicates with adjacent high order bit slices. In particular, a switching circuit associated with the defective bit slice sends write data to the next higher order bit slice and receives read data from the next higher order bit slice.

The redundancy function shown in FIG. 1B and described above is transparent to a processing device accessing the memory 10. It will be understood that the memory array 20 may have more or fewer bit slices than shown in FIGS. 1A and 1B.

Figure 2:
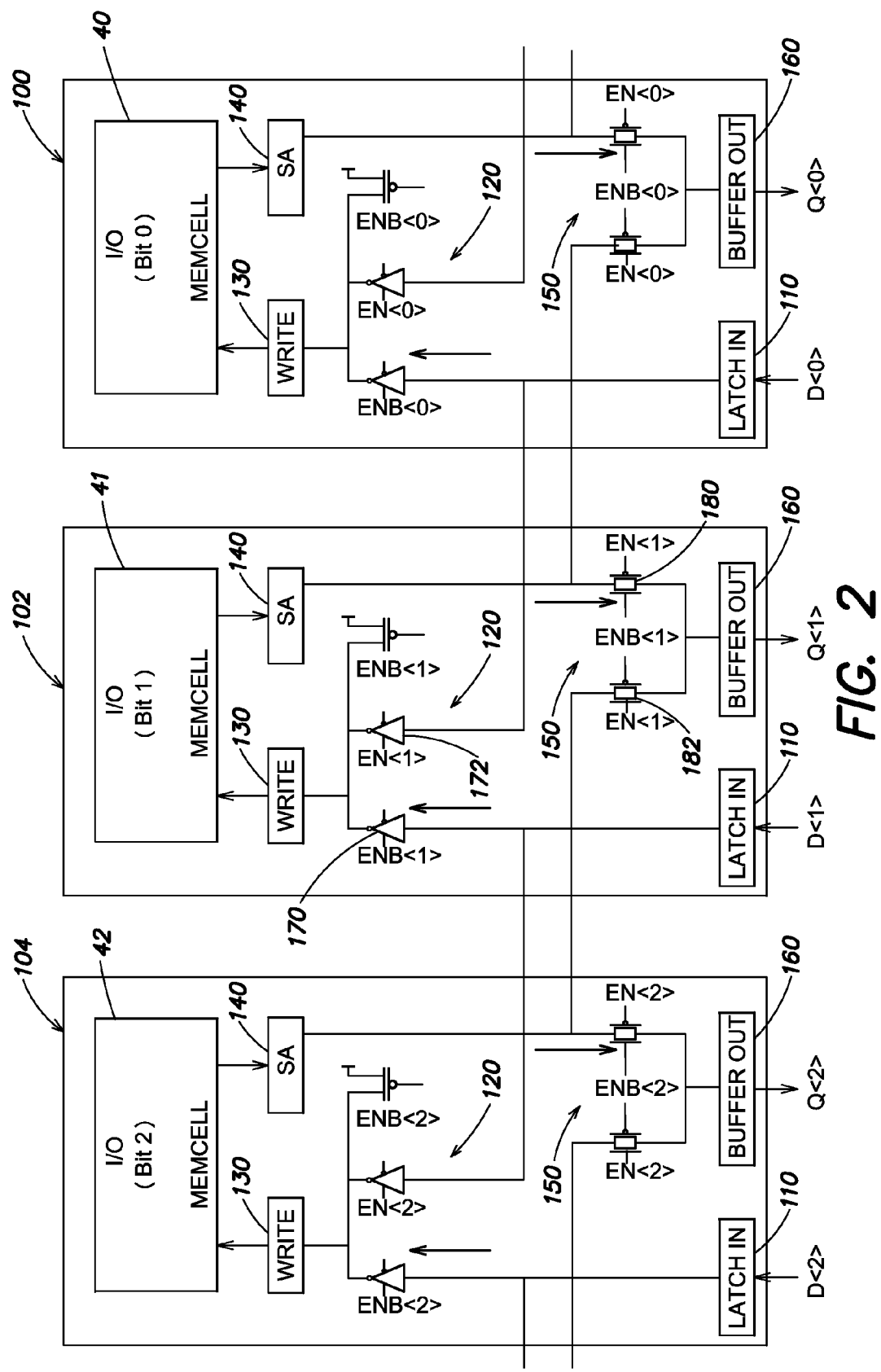
FIG. 2 is a schematic block diagram of a portion of a memory having redundancy, with the redundancy function disabled.
Figure 3:
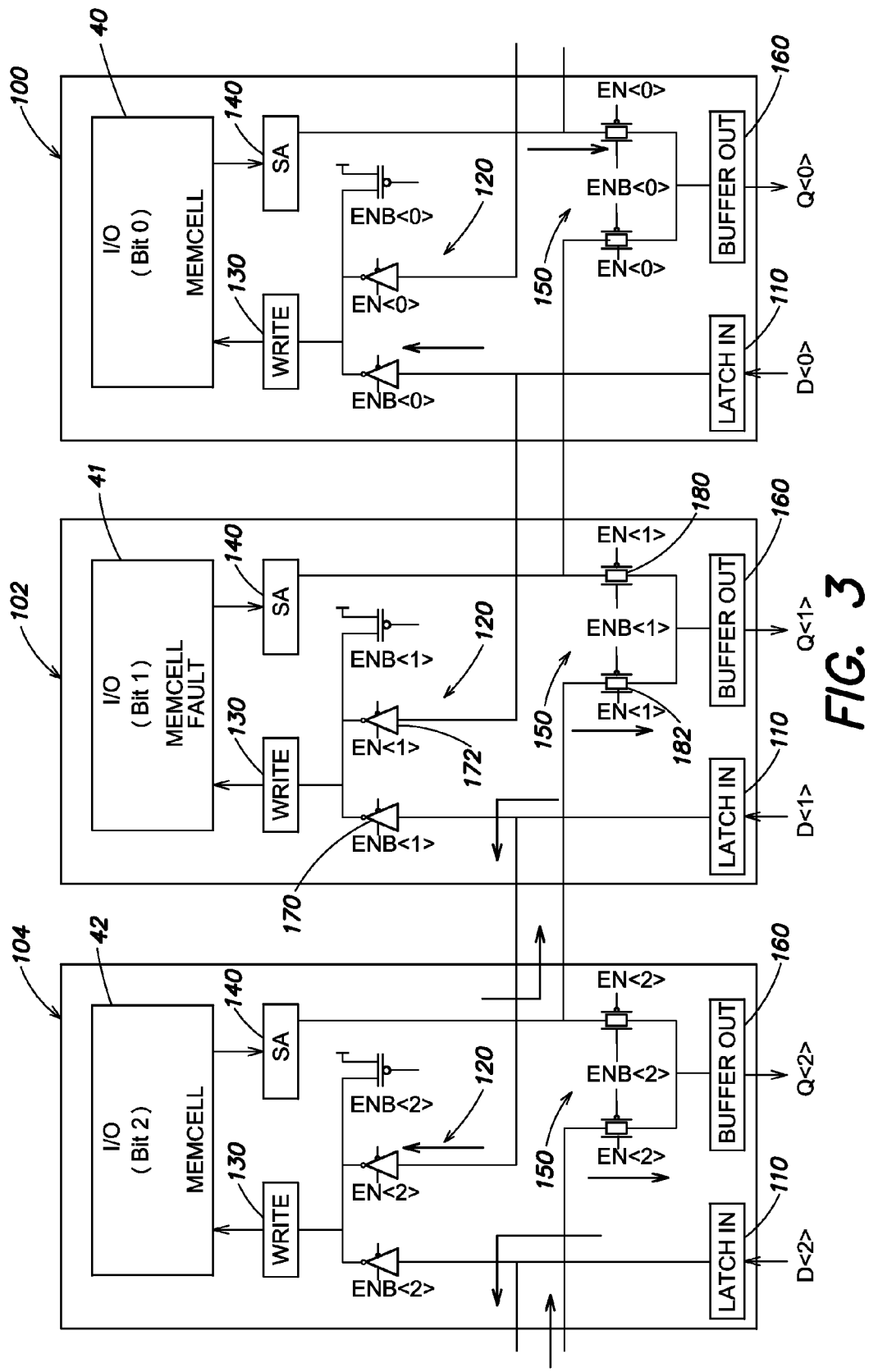
FIG. 3 is a schematic block diagram of a portion of a memory having redundancy, with the redundancy function enabled.

A portion of the I/O circuitry 30 is shown in greater detail in FIG. 2. Circuitry corresponding to three bit slices of the memory array is shown in FIGS. 2 and 3. FIG. 2 illustrates operation with the redundancy function disabled or operation in the case of no defective bit slices. A switching circuit 100 is associated with bit slice 40 of the memory array, a switching circuit 102 is associated with bit slice 41, and a switching circuit 104 is associated with bit slice 42. The switching circuits 100, 102 and 104 form switching control logic.

Circuit 102 includes a latch 110 which receives write data bit D<1> from an external source, such as a processing device, and provides write data bit D<1> to a multiplexer 120. An output of multiplexer 120 is coupled through a write circuit 130 to associated bit slice 41 of memory array 20. Circuit 102 further includes a sense amplifier 140 which receives a read bit from bit slice 41 of memory array 20 and provides an output to a multiplexer 150. The output of multiplexer 150 is supplied through a buffer 160 as a read data bit Q<1>. The multiplexers 120 and 150 in circuits 100, 102 and 104 are controlled by respective enable signals EN<0>, EN<1> and EN<2> provided by comparison logic as described below.

Multiplexer 120 in circuit 102 includes a first gate 170 which receives an output from latch 110 of circuit 102 and a second gate 172 which receives an input from latch 110 in adjacent circuit 100 of lower order. The gates 170 and 172 are controlled by the enable signal EN<1>. Multiplexer 120 in effect selects write data bit D<1> from the associated circuit 102 or write data bit D<0> from the adjacent circuit 100 of lower order, in response to the enable signal EN<1>.

Multiplexer 150 in circuit 102 includes a first gate 180 which receives an output from sense amplifier 140 of the associated circuit 102 and a second gate 182 which receives an input from sense amplifier 140 of the adjacent circuit 104 of higher order.

The gates 180 and 182 are controlled by enable signal EN<1>. The multiplexer 150 in effect selects the read data bit from the associated element 41 or from the adjacent element 42 of higher order and provides read data bit Q<1>.

FIG. 2 illustrates a condition where the redundancy function is disabled or the memory does not have a defective bit slice. Accordingly, each of the switching circuits 100, 102 and 104 routes data to and from the bit slice of the memory array 20 with which it is associated (the associated bit slice). In particular, multiplexer 120 of circuit 100 routes write data D<0> through write circuit 130 of circuit 100 to bit slice 40, multiplexer 120 of circuit 102 routes write data D<1> through write circuit 130 of circuit 102 to bit slice 41, and multiplexer 120 of circuit 104 routes write data D<2> through write circuit 130 of circuit 104 to bit slice 42. Similarly, multiplexer 150 of circuit 100 routes read data from sense amplifier 140 of circuit 100 through buffer 160 to provide read data Q<0>, multiplexer 150 of circuit 102 routes read data from sense amplifier 140 of circuit 102 through buffer 160 to provide read data Q<1>, and multiplexer 150 of circuit 104 routes read data from sense amplifier 140 of circuit 104 through buffer 160 to provide read data Q<2>. The directions of data flow are indicated by arrows in FIG. 2. In the example of FIG. 2, no switching of data to or from adjacent bit slices is performed.

Referring now to FIG. 3, the switching circuits 100, 102 and 104 are illustrated in a condition where bit slice 41 of memory array 20 is defective. In the example of FIG. 3, circuit 100 routes data to and from the associated bit slice 40 of memory array 20 without modification. Since bit slice 40 is of lower order than defective bit slice 41, multiplexer 120 of circuit 100 selects write data bit D<0> from latch 110 of circuit 100 and provides write data bit D<0> through write circuit 130 to bit slice 40 of the memory array. Similarly, multiplexer 150 of circuit 100 selects the read data bit from sense amplifier 140 of circuit 100 and provides read data bit Q<0> through buffer 160 of circuit 100. The directions of data flow are indicated by arrows in FIG. 3.

Circuit 102, which is associated with the defective bit slice 41 of memory array 20, operates in a different manner. In particular, circuit 102 sends write data to and receives read data from circuit 104 associated with bit slice 42. Gates 170 and 172 of multiplexer 120 in circuit 102 are both disabled, so that no data is written to defective bit slice 41 of the memory array. Instead, write data D<1> from circuit 102 is supplied to second gate 172 of circuit 104 which is associated with bit slice 42 and write data D<2> is supplied to the adjacent circuit (not shown) of higher order which is associated with bit slice 43 (FIG. 1B). Thus, the write data is effectively shifted away from defective bit slice 41 to adjacent bit slice 42.

Similarly, gate 180 of multiplexer 150 in circuit 102 is disabled, so that no data is read from defective bit slice 41. Instead, second gate 182 of multiplexer 150 in circuit 102 is enabled, and receives read data from sense amplifier 140 in adjacent circuit 104. The read data from adjacent circuit 104 is provided through buffer 160 of circuit 102 as read data Q<1>.

In a similar manner, circuit 104 corresponding to bit slice 42 and the circuits corresponding to all subsequent bit slices of the memory array are configured to write data to the adjacent bit slice of higher order and to read data from the adjacent bit slice of higher order.

Figure 4:
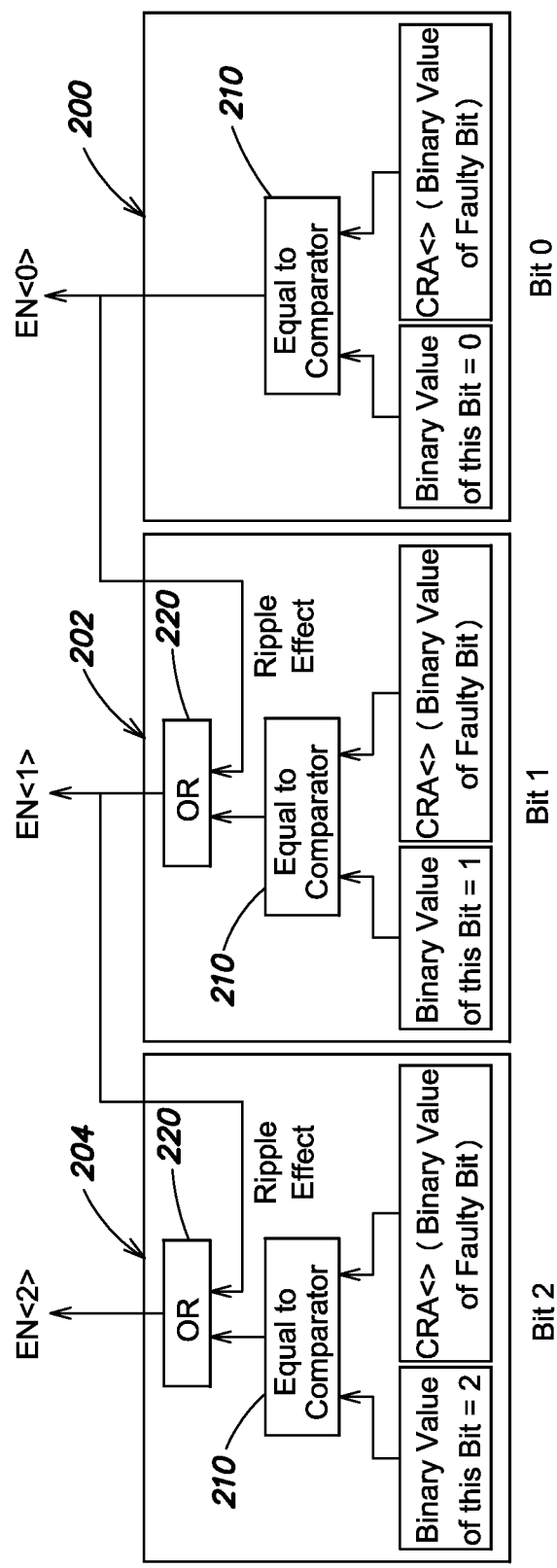
FIG. 4 is a schematic block diagram of known comparison logic.

Conventional comparison logic for controlling multiplexers 120 and 150 is shown in FIG. 4. The comparison logic includes a comparator circuit corresponding to each bit slice of the memory array. A comparator circuit 200 controls multiplexers 120 and 180 in switching circuit 100 (FIGS. 2 and 3), a comparator circuit 202 controls multiplexers 120 and 180 in switching circuit 102, and a comparator circuit 204 controls multiplexers 120 and 180 in switching circuit 104. Each of the comparator circuits 200, 202 and 204 includes an equal-to comparator 210 which provides an output if digital values at its two inputs are equal.

Each equal-to comparator 210 receives at its respective inputs a binary value of the associated bit slice of the memory array. Thus, in the comparison logic of FIG. 4, comparator circuit 200 receives the binary value 0 of bit slice 40, comparator circuit 202 receives the binary value 1 of bit slice 41 and comparator circuit 204 receives the binary value 2 of bit slice 42.

A binary value CRA that specifies the location of a defect is provided to a second input of each of the equal-to comparators 210. The binary value CRA may be received from BIST logic associated with the memory. In particular, the integrated circuit containing the memory may include BIST logic to check the memory functionality. In case of a defect in the memory array, which is correctable by enabling redundancy, the BIST logic provides the value CRA of the defect location which may, for example, be hard coded. The BIST logic is external to the memory itself.

Each comparator circuit further includes an OR gate 220 which receives the output of the equal-to comparator 210 of the same comparator circuit and the enable output EN of the adjacent comparator circuit. Thus, for example, OR gate 220 in comparator circuit 202 receives the output of equal-to comparator 210 and receives the enable output EN<0> of adjacent comparator circuit 200. Similarly, OR gate 220 in comparator circuit 204 receives the output of equal-to comparator 210 and the enable output EN<1> of adjacent comparator circuit 202.

It may be observed that an equal-to condition detected by one of the equal to comparators 210 causes that comparator circuit and all higher order comparator circuits to provide an active enable signal. The fact that each comparator circuit provides an output to the adjacent comparator circuit creates a ripple effect in which a fault in one of the comparator circuits propagates to all of the comparator circuits of higher order than the comparator circuit containing the fault. This can potentially result in a multibit error, which is difficult to detect.

Figure 5:
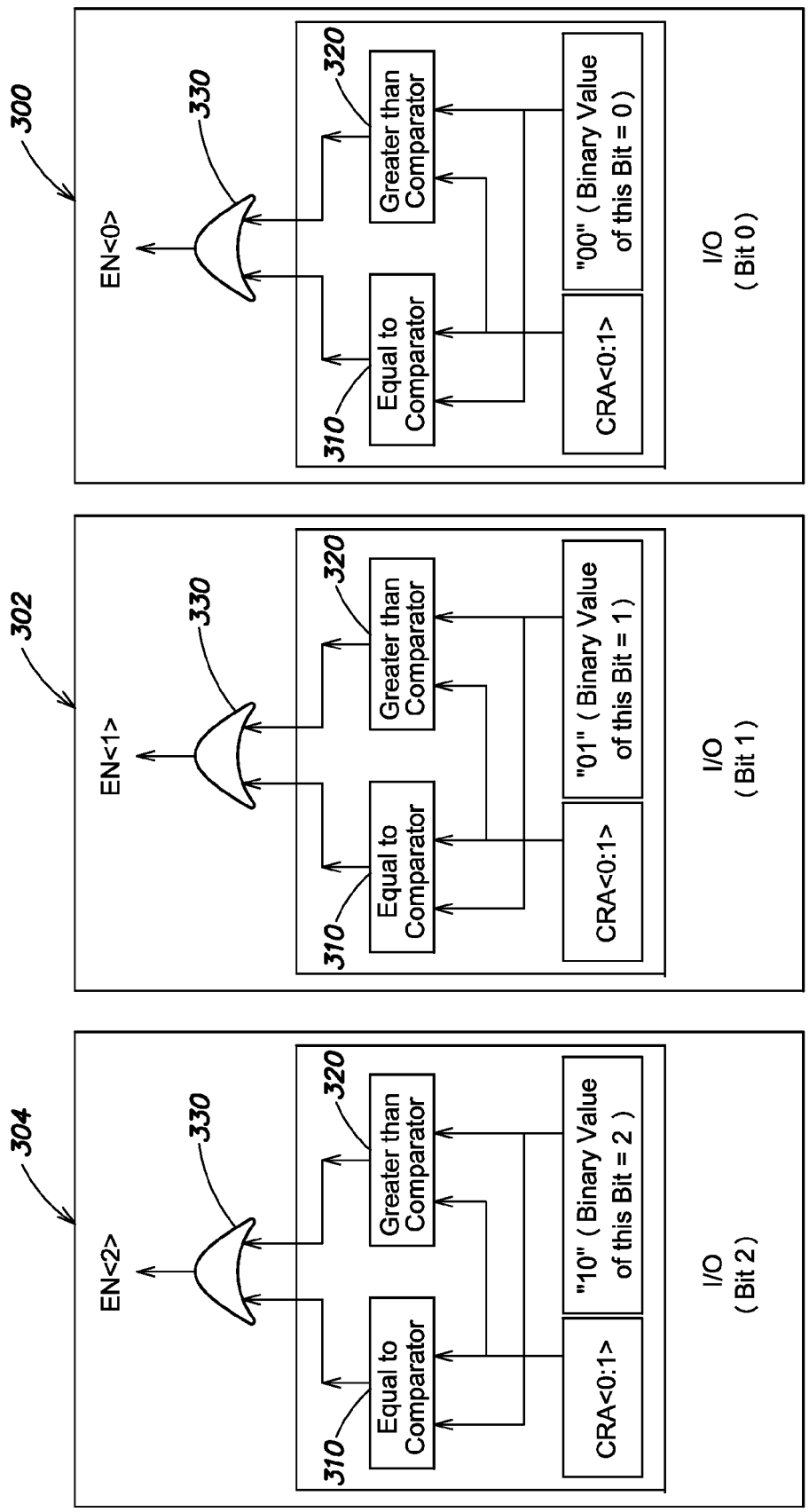
FIG. 5 is a schematic block diagram of comparison logic in accordance with a first embodiment.

A first embodiment of comparison logic is shown in FIG. 5, which shows comparison logic for three bit slices of the memory. Comparison logic associated with three bit slices of a multiple bit slice memory is shown in FIG. 5. In particular, the comparison logic of FIG. 5 includes a comparator circuit 300 associated with bit slice 40, a comparator circuit 302 associated with bit slice 41, and a comparator circuit 304 associated with bit slice 42. Each of the comparator circuits 300, 302 and 304 includes an equal-to comparator 310, a greater-than comparator 320 and an OR gate 330. The equal-to comparator 310 and the greater-than comparator 320 each receive the binary value of the associated bit slice of the memory at a first input and the binary value CRA of the defect location at a second input. The outputs of the equal-to comparator 310 and the greater-than comparator 320 are provided to first and second inputs of OR gate 330. The output of OR gate 330 is the enable signal EN which controls the multiplexers 120 and 150 shown in FIGS. 2 and 3 and described above. In particular, comparator circuit 300 provides enable signal EN<0>, comparator circuit 302 provides enable signal EN<1> and comparator circuit 304 provides enable signal EN<2>. Each OR gate 330 provides an active enable signal EN if (1) the binary value of the associated bit slice is equal to the binary value CRA of the defect location (equal-to comparator 310) or (2) the binary value of the associated bit slice is greater than the binary value CRA of the defect location (greater-than comparator 320). It may be observed that each of the comparator circuits 300, 302 and 304 operates independently, and that a fault in one comparator circuit does not propagate to other comparator circuits, as in the case of FIG. 4.

Figure 6:
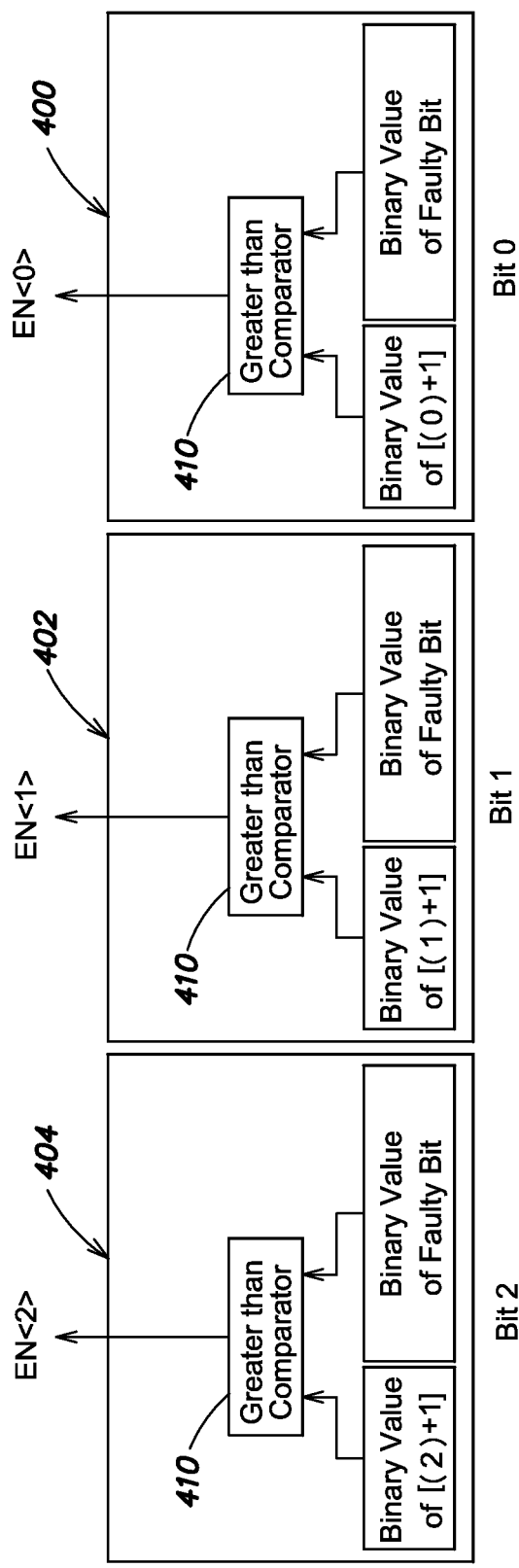
FIG. 6 is a schematic block diagram of comparison logic in accordance with a second embodiment.

Comparison logic in accordance with a second embodiment is shown in FIG. 6. Comparison logic associated with three bit slices of a multiple bit slice memory is shown in FIG. 6. The comparison logic of FIG. 6 includes a comparator circuit 400 associated with bit slice 40, a comparator circuit 402 associated with bit slice 41, and a comparator circuit 404 associated with bit slice 42. Each of the comparator circuits 400, 402 and 404 includes a greater-than comparator 410. Each of the greater-than comparators 410 receives at a first input a value which is the location value of the associated bit slice of the memory array+1 and receives at a second input the binary value CRA of the defect location. In particular, the first input of each greater-than comparator 410 receives an Input=binary value of associated bit slice+1. Thus, for example, greater-than comparator 410 in comparator circuit 402, which is associated with bit slice 41 (bit 1), receives the Input="01"+1="10". The addition of 1 to each binary value of the associated element compensates for the fact that the comparator circuit does not include an equal-to comparator. The output of each greater-than comparator 410 is the enable signal EN. Thus, for example, the comparator circuit 402 provides the enable signal EN<1> for bit slice 41.

Figure 7:
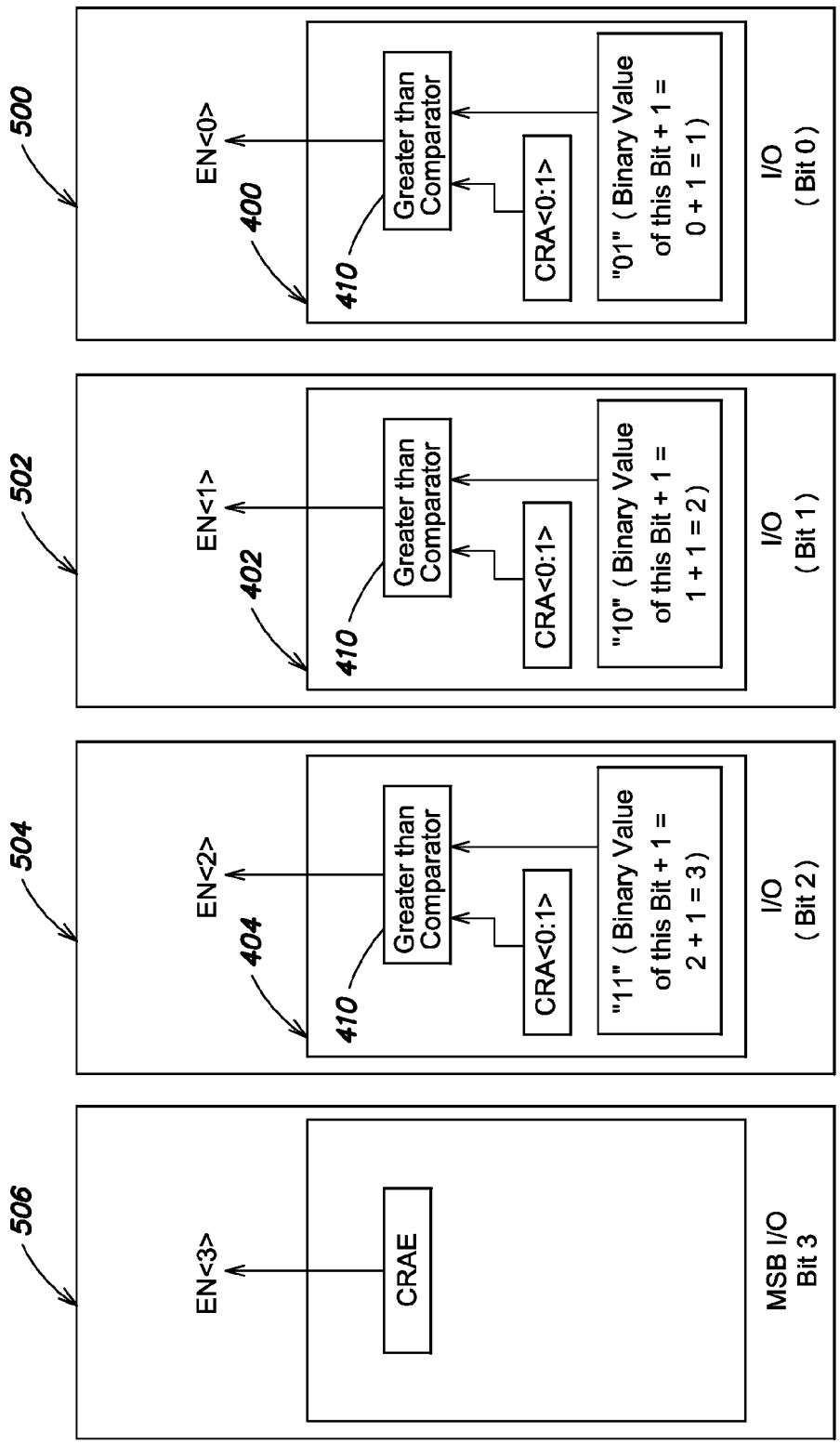
FIG. 7 is a schematic block diagram of comparison logic, showing another implementation of the second embodiment.

Another implementation of the second embodiment is shown in FIG. 7. In FIG. 7, comparator circuits 400, 402 and 404 are associated with bit slices 500, 502 and 504, respectively, of the memory array. Assume that bit slice 502 of the memory array has a defect, so that the binary value CRA of the defect location is "01". In each of the comparator circuits 400, 402 and 404, the binary value of the associated bit slice+1 is provided to the greater-than comparator 410. Thus, in comparator circuit 400, the greater-than comparator 410 receives the binary value of the associated element at a first input and receives the binary value CRA of the defect location at a second input. In particular, the first input of comparator 410 in comparator circuit 400 receives the Input="00"+1="01" and the second input receives the CRA value of "01". Since the two inputs are equal, the greater-than comparator 410 in comparator circuit 400 does not provide an active enable signal EN<0>. In comparator circuit 402, the first input of comparator 410 receives the Input="01"+1="10" and the second input receives the CRA value of "01". Accordingly, the first input is greater than the second input and the greater-than comparator 410 in comparator circuit 402 provides an active enable signal EN<1>. Similarly, greater-than comparator 410 in comparator circuit 404 provides an active enable signal EN<2>. The arrangement of FIG. 7 has the same effect as the comparator circuits shown in FIG. 5 and described above, but eliminates the need for an equal-to comparator.

The addition of 1 to each binary value of the associated bit slice compensates for the fact that the comparator circuit does not include an equal-to comparator. However, provision must be made for the bit slice of the memory array corresponding to the most significant bit (MSB). In this case, advantage is taken of the fact that a bit slice 506 corresponding to the MSB is the redundancy bit slice and is always enabled in the case of a defect. Accordingly, a redundancy enable signal CRAE can be used as the enable signal EN<3> for element 506. That is, the enable signal EN<3> is active at any time that a defect has been detected and the redundancy function is utilized.

Figure 8:
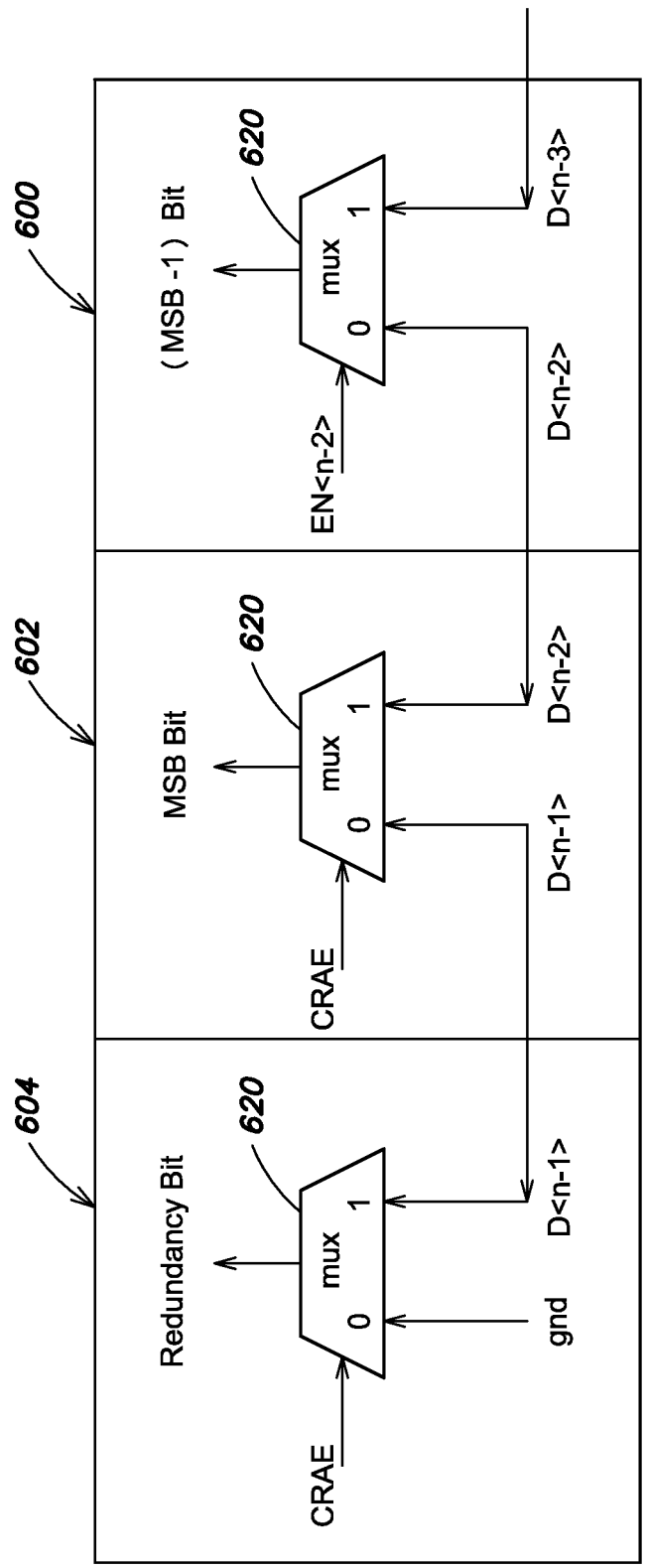
FIG. 8 is a schematic block diagram of data switching logic in accordance with the second embodiment.

Data switching logic for use with the comparison logic of FIG. 7 is shown in the schematic block diagram of FIG. 8 for the case of an n-bit memory, where the MSB and MSB-1 bits are shown. A switching circuit 600 corresponds to the MSB-1 bit slice of the memory array, a switching circuit 602 corresponds to the MSB bit slice of the memory array, and a switching circuit 604 corresponds to the redundancy bit slice of the memory array. Each of the switching circuits 600, 602 and 604 includes a multiplexer 620 which corresponds to the multiplexer 120 shown in FIGS. 2 and 3 and described above. The multiplexer 620 in switching circuit 600 receives write data bit D<n-3> from the adjacent switching circuit (not shown) at a first input and receives the associated write data bit D<n-2> at a second input. The multiplexer 620 in switching circuit 600 is controlled by enable signal EN<n-2>. The multiplexer 620 in switching circuit 602 receives the write data bit D<n-2> from adjacent switching circuit 600 at a first input and receives the associated write data bit D<n-1> at a second input. The multiplexer 620 in switching circuit 602 is controlled by redundancy enable signal CRAE. The multiplexer 620 in switching circuit 604 receives the write data bit D<n-1> from adjacent switching circuit 602 at a first input, and a second input is connected to ground. The multiplexer 620 in switching circuit 604 is controlled by the redundancy enable signal CRAE.

Having thus described at least one illustrative embodiment of the invention, various alterations, modifications and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. Repair control logic for a safe memory having redundant elements, comprising:
   comparison logic comprising, for each bit slice of a memory array, a comparator circuit configured to determine whether a location value of an associated bit slice of the memory array is greater than a location value of a defective bit slice of the memory array; and
   data switching logic comprising, for each bit slice of the memory array, a switching circuit, responsive to a determination that the location value of the associated bit slice is greater than the location value of the defective bit slice, to switch data from the associated bit slice to an adjacent bit slice of the memory array.

2. Repair control logic as defined in claim 1, wherein the comparator circuit for each bit slice of the memory array comprises an equal-to comparator, a greater-than comparator and an OR circuit receiving outputs of the equal-to comparator and the greater-than comparator.

3. Repair control logic as defined in claim 1, wherein the comparator circuit for each bit slice of the memory array comprises a greater-than comparator and wherein a value of one is added to the location value of the associated bit slice.

4. Repair control logic as defined in claim 3, wherein an enable signal for a most significant bit comprises a redundancy enable bit.

5. Repair control logic as defined in claim 1, wherein the switching circuit for each bit slice of the memory array is configured to control writing of data to the memory array in response to an enable signal from the respective comparator circuit.

6. Repair control logic as defined in claim 1, wherein the switching circuit for each bit slice of the memory array is configured to control reading of data from the memory array in response to an enable signal from the respective comparator circuit.

7. Repair control logic as defined in claim 1, wherein the switching circuit for each bit slice of the memory array comprises a multiplexer controlled by an enable signal from the respective comparator circuit.

8. A method for repair control of a safe memory having redundant elements, comprising:
   determining, by a comparator circuit for each bit slice of a memory array, whether a location value of an associated bit slice of the memory array is greater than a location value of a defective bit slice of the memory array; and
   switching, by a switching circuit for each bit slice of the memory array, data from the associated bit slice to an adjacent element of the memory array in response to a determination that the location value of the associated bit slice is greater than the location value of the defective bit slice.

9. A method for repair control of a safe memory as defined in claim 8, wherein the comparator circuit for each bit slice of the memory array comprises an equal-to comparator, a greater-than comparator and an OR circuit receiving outputs of the equal-to comparator and the greater-than comparator.

10. A method for repair control of a safe memory as defined in claim 8, wherein the comparator circuit for each bit slice of the memory array comprises a greater-than comparator and wherein a value of one is added to the location value of the associated bit slice.

11. A method for repair control of a safe memory as defined in claim 10, wherein an enable signal for a most significant bit comprises a redundancy enable bit.

12. A method for repair control of a safe memory as defined in claim 8, wherein the switching circuit for each bit slice of the memory array controls writing of data to the memory array in response to an enable signal from the respective comparator circuit.

13. A method for repair control of a safe memory as defined in claim 8, wherein the switching circuit for each bit slice of the memory array controls reading of data from the memory array in response to an enable signal from the respective comparator circuit.

14. A method for repair control of a safe memory as defined in claim 8, wherein switching data comprises controlling a multiplexer with an enable signal from the respective comparator circuit.

15. Repair control logic for a safe memory having redundant elements, comprising:
   a comparator circuit configured to determine whether a location value of an associated bit slice of a memory array is greater than a location value of a defective bit slice of the memory array; and
   a switching circuit, responsive to a determination that the location value of the associated bit slice is greater than the location value of the defective bit slice, to switch data from the associated bit slice to an adjacent bit slice of the memory array.

16. Repair control logic as defined in claim 15, wherein the comparator circuit comprises an equal-to comparator, a greater-than comparator and an OR circuit receiving outputs of the equal-to comparator and the greater-than comparator.

17. Repair control logic as defined in claim 15, wherein the comparator circuit comprises a greater-than comparator and wherein a value of one is added to the location value of the associated bit slice.

18. Repair control logic as defined in claim 15, wherein the switching circuit is configured to control writing of data to the memory array in response to an enable signal from the comparator circuit.

19. Repair control logic as defined in claim 15, wherein the switching circuit is configured to control reading of data from the memory array in response to an enable signal from the comparator circuit.

20. Repair control logic as defined in claim 15, wherein the switching circuit comprises a multiplexer controlled by an enable signal from the comparator circuit.

* * * * *